(12) United States Patent
Arai et al.

(10) Patent No.: US 10,290,570 B2
(45) Date of Patent: May 14, 2019

(54) WIRING SUBSTRATE

(71) Applicant: SHINKO ELECTRIC INDUSTRIES CO., LTD., Nagano (JP)

(72) Inventors: Tadashi Arai, Nagano (JP); Yoshikazu Hirabayashi, Nagano (JP); Hidetoshi Arai, Nagano (JP); Tadashi Kodaira, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 15/866,869

(22) Filed: Jan. 10, 2018

(65) Prior Publication Data

US 2018/0218972 A1 Aug. 2, 2018

(30) Foreign Application Priority Data

Jan. 30, 2017 (JP) ................. 2017-014614

(51) Int. Cl.
| | |
|---|---|
| *H05K 1/03* | (2006.01) |
| *H05K 1/11* | (2006.01) |
| *H05K 1/14* | (2006.01) |
| *H01L 23/498* | (2006.01) |
| *H01L 21/48* | (2006.01) |
| *H05K 1/02* | (2006.01) |

(52) U.S. Cl.
CPC ...... *H01L 23/49822* (2013.01); *H01L 21/486* (2013.01); *H01L 21/4867* (2013.01); *H05K 1/0373* (2013.01); *H05K 1/112* (2013.01); *H05K 1/14* (2013.01); *H01L 2224/32225* (2013.01); *H01L 2224/73204* (2013.01); *H01L 2224/81* (2013.01); *H05K 1/0284* (2013.01)

(58) Field of Classification Search
CPC ............. H01L 23/49822; H01L 21/486; H01L 21/4867; H05K 1/0284; H05K 1/0298; H05K 1/0313; H05K 1/0373; H05K 1/0393; H05K 1/11; H05K 1/111; H05K 1/112; H05K 1/119; H05K 1/14; H05K 3/386; H05K 3/42
See application file for complete search history.

(56) References Cited

U.S. PATENT DOCUMENTS

| | | | |
|---|---|---|---|
| 7,186,920 B2* | 3/2007 | Takeuchi | H05K 1/0265 174/254 |
| 7,576,288 B2* | 8/2009 | Kondo | H05K 3/4617 174/254 |
| 7,894,203 B2* | 2/2011 | Kariya | H01L 23/49827 361/763 |

FOREIGN PATENT DOCUMENTS

JP 2002-158446 5/2002

\* cited by examiner

*Primary Examiner* — Ishwarbhai B Patel
(74) *Attorney, Agent, or Firm* — IPUSA, PLLC

(57) ABSTRACT

A wiring substrate includes a first substrate and a second substrate stacked on the first substrate. The first substrate includes a first adhesive layer and conductive paste. The first adhesive layer is on a surface of a first insulating layer. The conductive paste is in an opening in the first adhesive layer. The second substrate includes a second adhesive layer and a protruding electrode. The second adhesive layer is on a surface of a second insulating layer facing toward the first substrate, and is bonded to the first adhesive layer. The protruding electrode has an end uncovered by the second adhesive layer, and is electrically connected to the conductive paste.

6 Claims, 9 Drawing Sheets

WIRING SUBSTRATE

CROSS-REFERENCE TO RELATED APPLICATION

This application is based upon and claims the benefit of priority of the prior Japanese Patent Application No. 2017-014614, filed on Jan. 30, 2017, the entire contents of which are incorporated herein by reference.

FIELD

A certain aspect of the embodiments discussed herein is related to wiring substrates.

BACKGROUND

A wiring substrate in which substrates are stacked in layers is known. For example, a wiring substrate where substrate elements each including a base film, wiring lines, and a cover film are stacked in layers and the wiring lines of the substrate elements are interconnected via conductive paste is known.

According to this wiring substrate, the base film and the cover film are formed of a flexible polyimide resin, and the cover film becomes adhesive when heated. (See, for example, Japanese Laid-open Patent Publication No. 2002-158446.)

SUMMARY

According to an aspect of the present invention, a wiring substrate includes a first substrate and a second substrate stacked on the first substrate. The first substrate includes a first adhesive layer and conductive paste. The first adhesive layer is on a surface of a first insulating layer. The conductive paste is in an opening in the first adhesive layer. The second substrate includes a second adhesive layer and a protruding electrode. The second adhesive layer is on a surface of a second insulating layer facing toward the first substrate, and is bonded to the first adhesive layer. The protruding electrode has an end uncovered by the second adhesive layer, and is electrically connected to the conductive paste.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
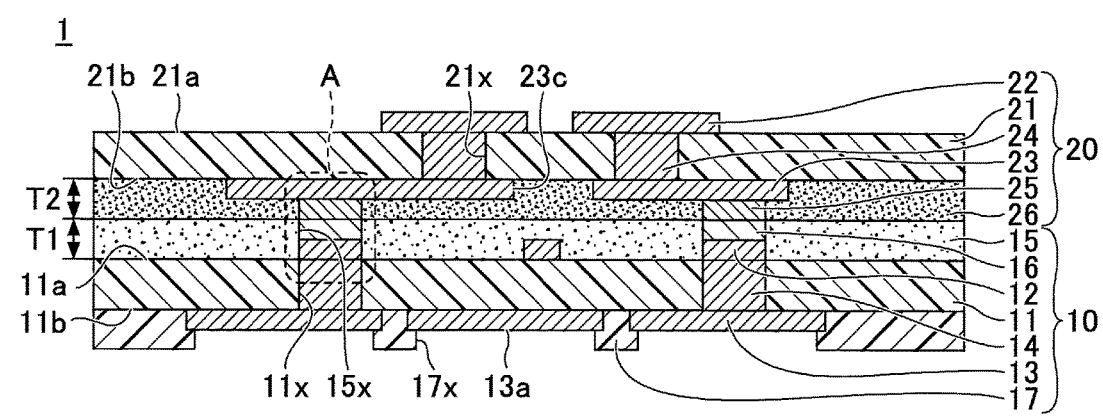
FIGS. 1A and 1B are cross-sectional views of a wiring substrate according to a first embodiment.

It is difficult for conventional wiring substrates to have sufficient adhesion (bond) strength between stacked substrates.

According to an aspect of the present invention, a wiring substrate with improved adhesion strength between stacked substrates is provided.

Preferred embodiments of the present invention will be explained with reference to accompanying drawings. In the following description, the same elements or components are referred to using the same reference numeral, and a repetitive description thereof may be omitted.

[a] First Embodiment

Figure 1B:
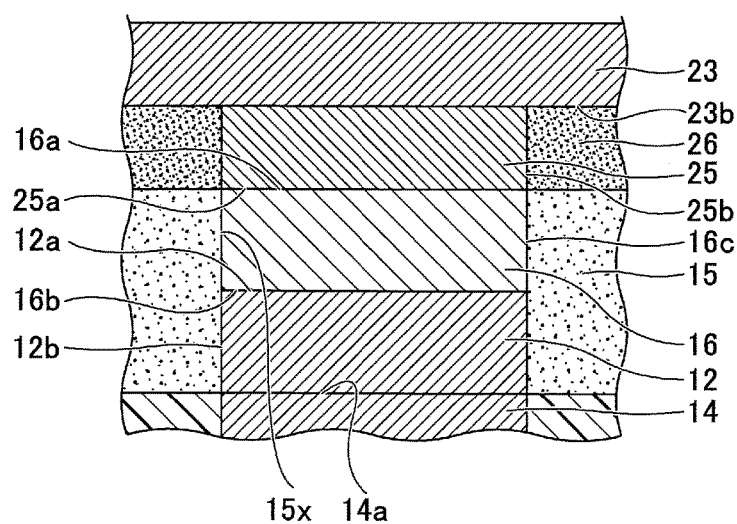

First, a structure of a wiring substrate according to a first embodiment is described. FIG. 1A is a cross-sectional view of the entirety of a wiring substrate according to the first embodiment. FIG. 1B is an enlarged view of part A of FIG. 1A.

Referring to FIGS. 1A and 1B, a wiring substrate 1 according to the first embodiment includes a first substrate 10 and a second substrate 20 stacked on the first substrate 10.

The first substrate 10 includes an insulating layer 11, a wiring layer 12, a wiring layer 13, through vias 14, a first adhesive layer 15, electrically conductive paste ("conductive paste") 16, and a solder resist layer 17. The second substrate 20 includes an insulating layer 21, a wiring layer 22, a wiring layer 23, through vias 24, metal pillars 25, and a second adhesive layer 26.

According to this embodiment, for convenience of description, the wiring layer 22 side of the wiring substrate 1 will be referred to as "upper side" or "first side," and the solder resist layer 17 side of the wiring substrate 1 will be referred to as "lower side" or "second side." Furthermore, with respect to each part or element of the wiring substrate 1, a surface on the wiring layer 22 side will be referred to as "upper surface" or "first surface," and a surface on the solder resist layer 17 side will be referred to as "lower surface" or "second surface." The wiring substrate 1, however, may be used in an inverted position or oriented at any angle. Furthermore, a plan view refers to a view of an object taken in a direction normal to an upper surface 21a of the insulating layer 21, and a planar shape refers to the shape of an object viewed in a direction normal to the upper surface 21a of the insulating layer 21.

According to the first substrate 10, the insulating layer 11 may be formed of a flexible insulating material such as a polyimide resin, a polyamide resin, or a liquid crystal polymer. Alternatively, a rigid material such as a so-called glass epoxy substrate having glass cloth impregnated with a thermosetting insulating resin such as an epoxy resin may be used as the insulating layer 11. As yet another alternative, a rigid material such as a substrate having a woven or nonwoven fabric of glass fibers, carbon fibers, or aramid fibers impregnated with a thermosetting insulating resin such as an epoxy resin or a polyimide resin may be used as the insulating layer 11. The insulating layer 11 may contain a filler such as silica ($SiO_2$). The thickness of the insulating layer 11 may be, for example, approximately 5 μm to approximately 50 μm.

The wiring layer 12 is provided on an upper surface 11a of the insulating layer 11. The wiring layer 13 is provided on a lower surface lib of the insulating layer 11. The wiring layer 12 and the wiring layer 13 are electrically connected to the through vias 14 filling in through holes 11x piercing through the insulating layer 11. The planar shape of the through vias 14 may be, for example, a circle having a diameter of approximately 60 μm.

The wiring layer 12 formed on upper end faces 14a of the through vias 14 serves as pads to be connected to the metal pillars 25 via the conductive paste 16. The diameter of the wiring layer 12 (pads) may be greater than the diameter of the through vias 14. Furthermore, the wiring layer 12 (pads) may be provided other than immediately on the upper end faces 14a of the through vias 14.

Suitable materials for the wiring layers 12 and 13 include, for example, copper (Cu). The thickness of each of the wiring layers 12 and 13 may be, for example, approximately 2 μm to approximately 30 μm. Suitable materials for the through vias 14 include, for example, copper (Cu), gold (Au), and silver (Ag). The wiring layer 13 and the through vias 14 may have a one-piece structure.

The first adhesive layer 15 is provided over the entirety of the upper surface 11a of the insulating layer 11 to cover an upper surface 12a and a side surface 12b of the wiring layer 12, and a side surface 16c of the conductive paste 16. Furthermore, the first adhesive layer 15 is bonded to the second adhesive layer 26. A thickness T1 of the first adhesive layer 15 may be, for example, approximately 7 μm to approximately 50 μm.

Suitable materials for the first adhesive layer 15 include, for example, a photosensitive (thermosetting) insulating resin containing an epoxy resin and a polyimide resin, a non-photosensitive (thermosetting) insulating resin containing an epoxy resin and a polyimide resin, and other photosensitive or non-photosensitive (thermosetting) insulating resins. The material of the first adhesive layer 15 may be suitably selected in view of, for example, adhesion to and a difference in the coefficient of thermal expansion from the insulating layer 11.

The first adhesive layer 15 includes openings 15x formed in the first adhesive layer 15 to expose the wiring layer 12 (pads) on the upper end faces 14a of the through vias 14. The openings 15x are filled with the conductive paste 16, which is thermosetting. A lower end face 16b of the conductive paste 16 is in contact with the wiring layer 12 (pads). Thus, the conductive paste 16 and the wiring layer 12 are electrically connected. The planar shape of the conductive paste 16 may be, for example, a circle having a diameter of approximately 60 μm. In this case, the diameter of the conductive paste 16 may be equal to or nearly equal to the diameter of the wiring layer 12 (pads). The diameter of the conductive paste 16, however, may also be smaller or greater than the diameter of the wiring layer 12 (pads) when it is possible to ensure the connection reliability of the conductive paste 16 and the wiring layer 12 (pads).

As the conductive paste 16, for example, copper paste may be used. Other kinds of conductive paste than copper paste, such as silver paste and gold paste, may also be used as the conductive paste 16. The thickness of the conductive paste 16 may be, for example, approximately 15 μm to approximately 45 μm. The conductive paste 16 contains metal powder serving as a principal component dispersed in a resin serving as a binder. As the metal powder, copper powder, silver powder, or gold powder may be suitably used. Alternatively, the metal powder of an alloy of two or more kinds of metal or a mixture of two or more kinds of metal powder may also be used. As the resin to serve as a binder, for example, an epoxy resin or a polyimide resin may be used.

The solder resist layer 17 is formed on the lower surface 11b of the insulating layer 11 to cover the wiring layer 13. The solder resist layer 17 includes openings 17x. A lower surface 13a of the wiring layer 13 is partly exposed at the bottom of the openings 17x. The wiring layer 13 exposed at the bottom of the openings 17x serves as pads to be electrically connected to, for example, another wiring substrate, a semiconductor package, or a semiconductor chip. Suitable materials for the solder resist layer 17 include, for example, photosensitive epoxy insulating resins and photosensitive acrylic insulating resins. The thickness of the solder resist layer 17 may be, for example, approximately 10 μm to approximately 30 μm.

According to the second substrate 20, the insulating layer 21 may be formed using a material illustrated as an example of the material of the insulating layer 11. The insulating layer 21, however, does not have to be formed of the same material as the insulating layer 11. The insulating layer 21 may contain a filler such as silica ($SiO_2$). The thickness of the insulating layer 21 may be, for example, approximately 5 μm to approximately 50 μm.

The wiring layer 22 is provided on the upper surface 21a of the insulating layer 21. The wiring layer 23 is provided on a lower surface 21b of the insulating layer 21. The wiring layer 22 and the wiring layer 23 are electrically connected via the through vias 24 filling in through holes 21x piercing through the insulating layer 21. The material and the thickness of the wiring layers 22 and 23 may be, for example, the same as those of the wiring layers 12 and 13. The material and the thickness of the through vias 24 may be, for example, the same as those of the through vias 14. The wiring layer 22 and the through vias 24 or the wiring layer 23 and the through vias 24 may have a one-piece structure.

The metal pillars 25, which are protruding electrodes, are formed on a lower surface 23b of the wiring layer 23. The planar shape of the metal pillars 25 may be, for example, a circle. In this case, the diameter of the metal pillars 25 may be equal to or nearly equal to the diameter of the conductive paste 16. The diameter of the metal pillars 25, however, may also be smaller or greater than the diameter of the conductive paste 16 when it is possible to ensure the connection reliability of the metal pillars 25 and the conductive paste 16. When the metal pillars 25 are smaller in diameter than the conductive paste 16, the diameter of the metal pillars 25 may be, for example, approximately 30 μm. Suitable materials for the metal pillars 25 include, for example, copper (Cu). The height of the metal pillars 25 may be, for example, approximately 5 μm to approximately 45 μm.

The second adhesive layer 26 is provided over the entirety of the lower surface 21b of the insulating layer 21. The second adhesive layer 26 covers the lower surface 23b and a side surface 23c of the wiring layer 23 and side surfaces 25b of the metal pillars 25. Ends (lower end faces 25a) of the metal pillars 25 are uncovered by the second adhesive layer 26 to be exposed. The ends of the metal pillars 25 are in contact with an upper end face 16a of the conductive paste 16. Thus, the metal pillars 25 and the conductive paste 16 are electrically connected. The second adhesive layer 26 is bonded to the first adhesive layer 15. A thickness T2 of the second adhesive layer 26 may be, for example, approximately 5 μm to approximately 30 μm.

The second adhesive layer 26 may be formed, for example, using a material illustrated as an example of the material of the first adhesive layer 15. The material of the second adhesive layer 26 may be suitably selected in view of, for example, adhesion to and a difference in the coefficient of thermal expansion from the insulating layer 21. While the second adhesive layer 26 does not have to be formed of the same material as the first adhesive layer 15, the adhesion of the first adhesive layer 15 and the second adhesive layer 26 can be further improved by forming the first adhesive layer 15 and the second adhesive layer 26 of the same material.

The interface between the metal pillars 25 and the conductive paste 16 and the interface between the second adhesive layer 26 and the first adhesive layer 15 do not necessarily have to be positioned in the same plane.

Next, a method of manufacturing a wiring substrate according to the first embodiment is described. FIGS. 2A through 2J are diagrams illustrating a process of manufacturing a wiring substrate according to the first embodiment. The wiring substrate 1 is manufactured as a multi-region substrate on which multiple regions to become wiring substrates 1 are provided, and is ultimately divided into individual pieces, so that the individual wiring substrates 1 are completed. A specific method of manufacturing the wiring substrate 1 is described below.

Figure 2A:
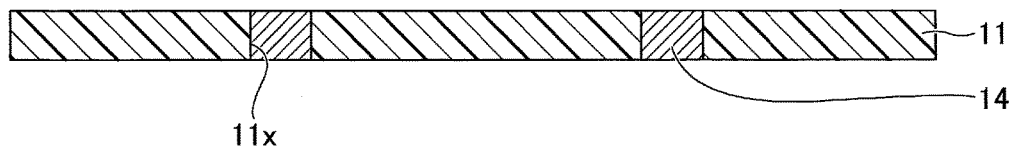
FIGS. 2A through 2J are diagrams illustrating a process of manufacturing a wiring substrate according to the first embodiment.

First, in the process depicted in FIG. 2A, the through vias 14 are formed in the insulating layer 11. Specifically, for example, the insulating layer 11 in film form is prepared, and the through holes 11x piercing through the insulating layer 11 are formed by, for example, laser processing. The material and the thickness of the insulating layer 11 are as described above. Then, the through holes 11x are filled with conductive paste, using, for example, a dispenser, and the conductive paste is thereafter cured to form the through vias 14. As the conductive paste to fill in the through holes 11x, for example, copper paste, gold paste, or silver paste may be used.

Use of a YAG laser or an excimer laser makes it possible to form the substantially cylindrical through holes 11x having a substantially vertical inner wall surface. When the insulating layer 11 is formed of a photosensitive resin, the through holes 11x may be formed by exposure to light and development. In this case, it is possible to form the substantially cylindrical through holes 11x having a substantially vertical inner wall surface by controlling the power of exposure light.

Figure 2B:
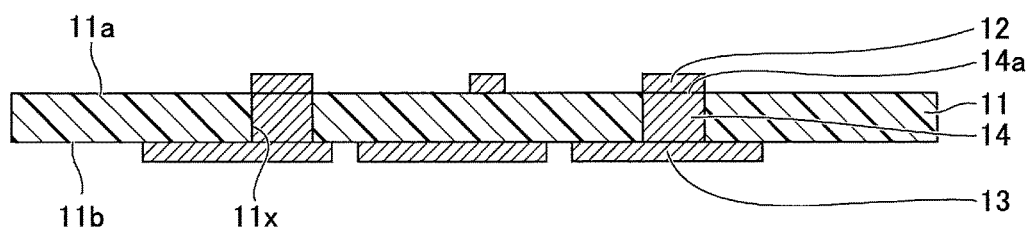

Next, in the process depicted in FIG. 2B, the wiring layer 12 and the wiring layer 13 are formed on the upper surface 11a and the lower surface 11b, respectively, of the insulating layer 11. The wiring layers 12 and 13 are electrically connected by the through vias 14. The wiring layer 12 formed on the upper end faces 14a of the through vias 14 serves as pads to be connected to the metal pillars 25 via the conductive paste 16. The wiring layers 12 and 13 may be formed by, for example, a semi-additive process. The material and the thickness of the wiring layers 12 and 13 are as described above. The diameter of the wiring layer 12 (pads) may be greater than the diameter of the through vias 14. Furthermore, the wiring layer 12 (pads) may be provided other than immediately on the upper end faces 14a of the through vias 14.

Figure 2C:
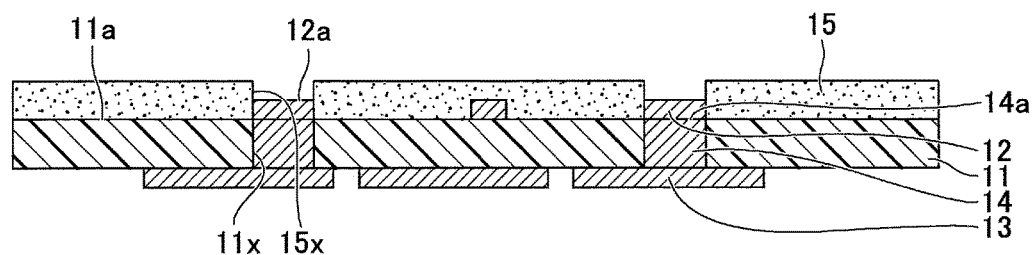

Next, in the process depicted in FIG. 2C, the first adhesive layer 15 is formed over the entirety of the upper surface 11a of the insulating layer 11 to selectively expose the wiring layer 12. Specifically, a laminate of the first adhesive layer 15 in B-stage (semi-cured) is provided over the entirety of the upper surface 11a of the insulating layer 11 to cover the wiring layer 12. Then, the first adhesive layer 15 covering the wiring layer 12 (pads) on the upper end faces 14a of the through vias 14 is removed by, for example, laser processing to form the openings 15x. As a result, the upper surface 12a of the wiring layer 12 (pads) is exposed in the openings 15x. The material and the thickness of the first adhesive layer 15 are as described above.

Figure 2D:
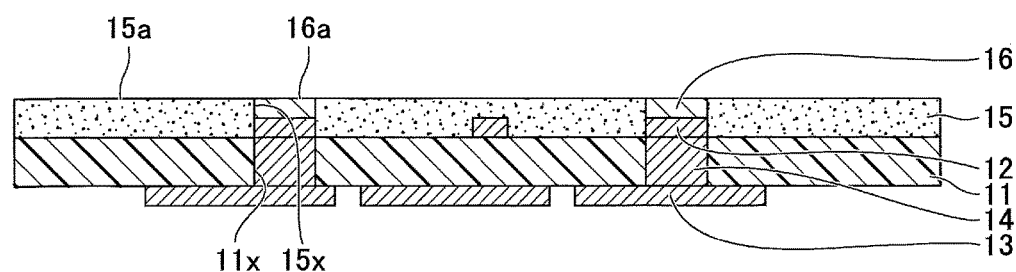

Next, in the process depicted in FIG. 2D, the openings 15x are filled with the conductive paste 16, using, for example, a dispenser. The openings 15x may be filled with the conductive paste 16 so that the upper end face 16a of the conductive paste 16 is flush with an upper surface 15a of the first adhesive layer 15. Alternatively, the individual openings 15x may be partly filled with the conductive paste 16 if no problem is caused to the connection with the metal pillars 25 in a subsequent process. As yet another alternative, the openings 15x may be fully filled with the conductive paste 16 with part of the conductive paste 16 protruding from the upper surface 15a of the first adhesive layer 15.

Figure 2E:
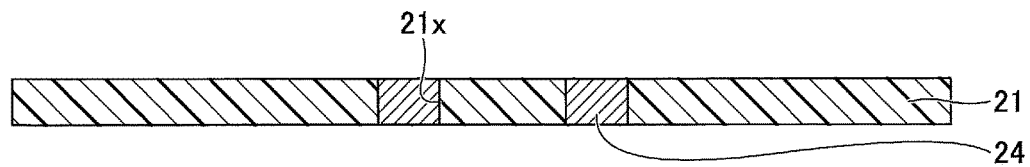

Next, in the process depicted in FIG. 2E, the insulating layer 21 is prepared. The material and the thickness of the insulating layer 21 are as described above. Then, the through holes 21x piercing through the insulating layer 21 are formed by, for example, laser processing. Next, the through holes 21x are filled with conductive paste, using, for example, a dispenser, and the conductive paste is thereafter cured to form the through vias 24. As the conductive paste to fill in the through holes 21x, for example, copper paste, gold paste, or silver paste may be used.

Use of a YAG laser or an excimer laser makes it possible to form the substantially cylindrical through holes 21x having a substantially vertical inner wall surface. When the insulating layer 21 is formed of a photosensitive resin, the through holes 21x may be formed by exposure to light and development. In this case, it is possible to form the substantially cylindrical through holes 21x having a substantially vertical inner wall surface by controlling the power of exposure light.

Figure 2F:
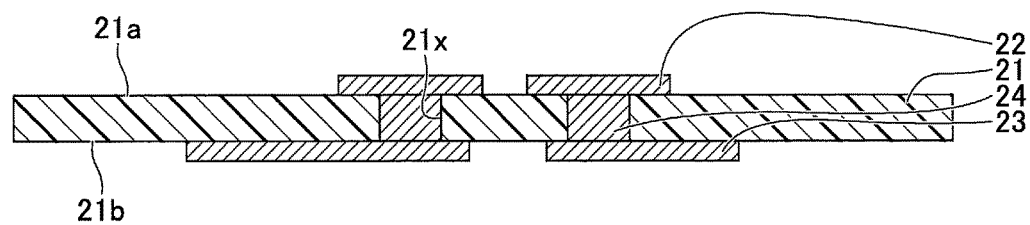

Next, in the process depicted in FIG. 2F, the wiring layer 22 and the wiring layer 23 are formed on the upper surface 21a and the lower surface 21b, respectively, of the insulating layer 21. The wiring layers 22 and 23 are electrically connected by the through vias 24. The wiring layers 22 and 23 may be formed by, for example, a semi-additive process. The material and the thickness of the wiring layers 22 and 23 are as described above.

Figure 2G:
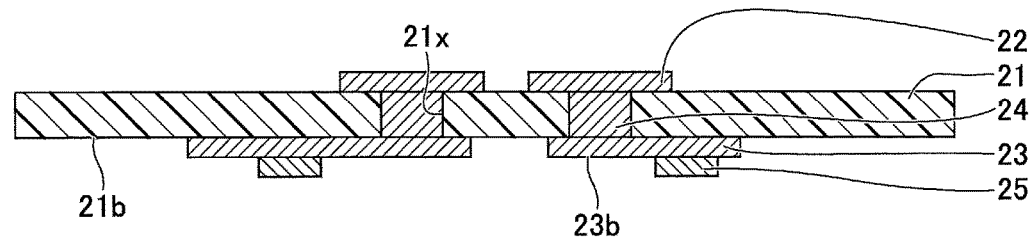

Next, in the process depicted in FIG. 2G, the metal pillars 25 are formed on the lower surface 23b of the wiring layer 23. The metal pillars 25 may be formed by, for example, a semi-additive process. The material and the height of the metal pillars 25 are as described above.

In the case of forming the metal pillars 25 by a semi-additive process, for example, a seed layer is formed on the entirety of each of the lower surface 21b of the insulating layer 21 and the lower surface 23b of the wiring layer 23 by sputtering or electroless plating of copper. Next, a plating resist layer having openings at positions where the metal pillars 25 are to be formed is formed on the lower surface of the seed layer, and the metal pillars 25 are formed on the seed layer exposed in the openings of the plating resist layer by electroplating of copper. Next, the plating resist layer is removed, and the seed layer except for where the metal pillars 25 are formed is removed.

Figure 2H:
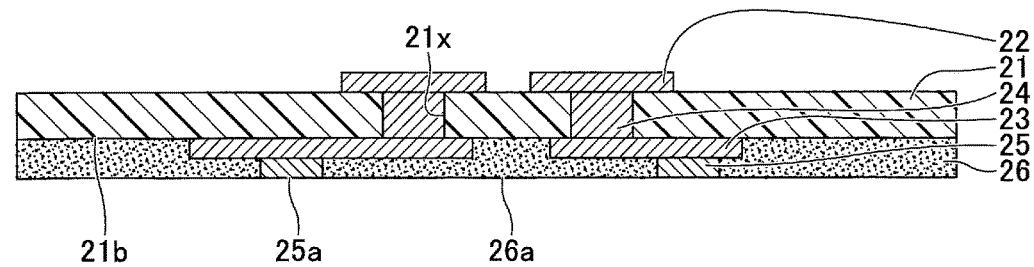

Next, in the process depicted in FIG. 2H, the second adhesive layer 26 is formed over the entirety of the lower surface 21b of the insulating layer 21 to cover the wiring layer 23 and expose the lower end faces 25a of the metal pillars 25. Specifically, for example, a laminate of the second adhesive layer 26 in B-stage (semi-cured) is provided over the entirety of the lower surface 21b of the insulating layer 21 to cover the wiring layer 23 and the metal pillars 25. Then, the second adhesive layer 26 covering the lower end faces 25a of the metal pillars 25 is removed by, for example, laser processing to expose the lower end faces 25a of the metal pillars 25 at a lower surface 26a of the second adhesive layer 26. The material and the thickness of the second adhesive layer 26 are as described above.

The lower end faces 25a of the metal pillars 25 may be flush with the lower surface 26a of the second adhesive layer 26. Alternatively, the lower end faces 25a of the metal pillars 25 may be depressed or protruding relative to the lower surface 26a of the second adhesive layer 26 if no problem is caused to the connection with the conductive paste 16 in the subsequent process.

Figure 2I:
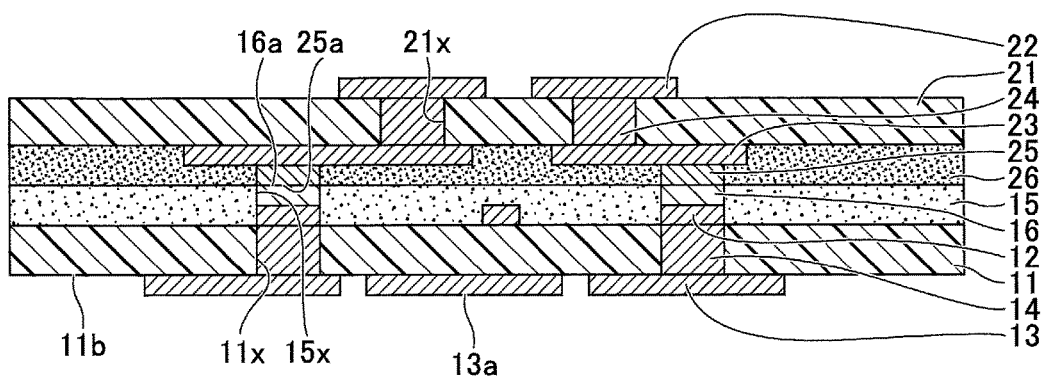

Next, in the process depicted in FIG. 2I, the structure depicted in FIG. 2H is stacked on the structure depicted in FIG. 2D. Specifically, the structure depicted in FIG. 2H is stacked on the structure depicted in FIG. 2D while aligning the structure depicted in FIG. 2H and the structure depicted in FIG. 2D so that the upper end face 16a of the conductive paste 16 of the structure depicted in FIG. 2D contacts the lower end faces 25a of the metal pillars 25 of the structure depicted in FIG. 2H. Thereafter, the conductive paste 16, the first adhesive layer 15, and the second adhesive layer 26 are heated to a predetermined temperature to be cured while pressing the structure depicted in FIG. 2H against the structure depicted in FIG. 2D.

As a result, the first adhesive layer 15 and the second adhesive layer 26 are bonded together, so that the structure depicted in FIG. 2H is fixed onto the structure depicted in FIG. 2D. Furthermore, the metal pillars 25 and the conductive paste 16 are joined together, so that the metal pillars 25 are electrically connected to the wiring layer 12 and the through vias 14 via the conductive paste 16.

The predetermined temperature for curing the conductive paste 16, the first adhesive layer 15, and the second adhesive layer 26 is, for example, approximately 180° C. This temperature is lower than the melting temperature of solder (for example, approximately 220° C.) in the case of using solder instead of the conductive paste 16. Therefore, it is possible to reduce the deflection of the wiring substrate 1.

Figure 2J:
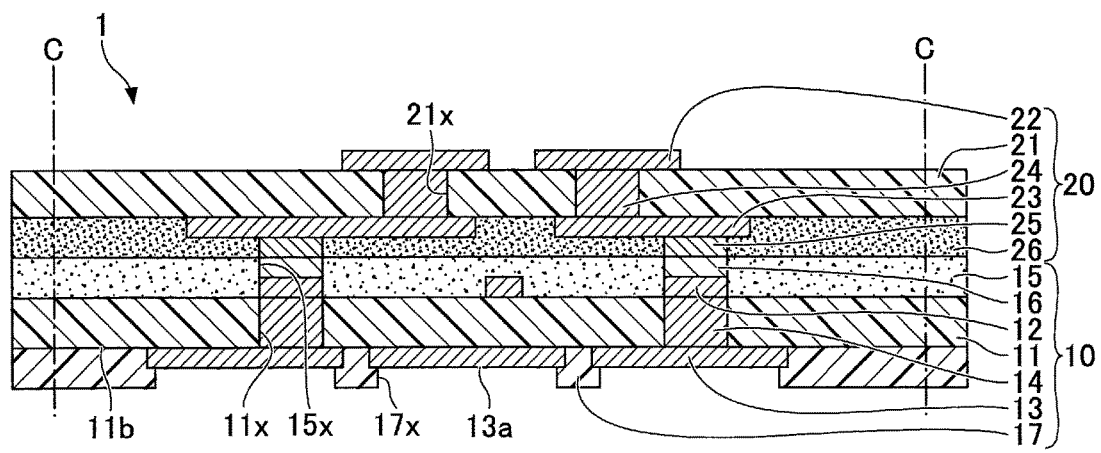

Next, in the process depicted in FIG. 2J, the solder resist layer 17 is formed on the lower surface 1ib of the insulating layer 11 to cover the wiring layer 13. To form the solder resist layer 17, for example, a photosensitive epoxy insulating resin or a photosensitive acrylic insulating resin in liquid or paste form may be applied on the lower surface 1ib of the insulating layer 11 to cover the wiring layer 13 by, for example, screen printing, roll coating, or spin coating. Alternatively, for example, a laminate of a photosensitive epoxy insulating resin or a photosensitive acrylic insulating resin in film form may be provided on the lower surface 1ib of the insulating layer 11 to cover the wiring layer 13.

The applied insulating resin or the laminate of insulating resin is exposed to light and developed to form the openings 17x (photolithography). As a result, the solder resist layer 17 having the openings 17x is formed, and the wiring layer 13 is partly exposed at the bottom of the openings 17x. Alternatively, a laminate of an insulating resin in film form in which the openings 17x are preformed may be provided on the lower surface 1ib of the insulating layer 11 to cover the wiring layer 13.

After the process depicted in FIG. 2J, the structure depicted in FIG. 2J is cut at cutting positions C into individual wiring substrates 1, using, for example, a slicer. As a result, the wiring substrate 1 as depicted in FIGS. 1A and 1B is completed.

The processes depicted in FIGS. 2A through 2D may be executed before, after, or in parallel with the processes depicted in FIGS. 2E through 2H. The formation of the solder resist layer 17 as depicted in FIG. 2J may be performed immediately after one of the processes depicted in FIG. 2B through 2D.

Moreover, in the case of further stacking another substrate, after the process depicted in FIG. 2I, metal pillars are formed on the lower surface 13a of the wiring layer 13 the same as in the process of FIG. 2G, and an adhesive layer is formed over the entirety of the lower surface 1ib of the insulating layer 11 to cover the wiring layer 13 while exposing the lower end faces of the metal pillars the same as in the process of FIG. 2H. Then, the same structure as depicted in FIG. 2D may be bonded to the lower side of the adhesive layer. By executing the same processes, any number of substrates may be stacked in layers. In this case, the conductive paste and the adhesive layers may be cured at a time.

Thus, the wiring substrate 1 can have sufficient adhesion strength between the first substrate 10 and the second substrate 20 because the adhesive layers (the first adhesive layer 15 and the second adhesive layer 26) are bonded together when stacking the second substrate 20 on the first substrate 10.

Furthermore, the first substrate 10 and the second substrate 20 are manufactured in separate processes and are thereafter stacked. In the case of further stacking substrates, the substrates may be manufactured in separate processes and stacked at a time. Therefore, it is possible to reduce the lead time. Furthermore, according to this method, it is possible to select and stack only acceptable substrates. Therefore, it is possible to improve the yield rate of wiring substrates.

Variation of First Embodiment

According to a variation of the first embodiment, the through vias 24 are formed by a method different from that of the first embodiment. In the description of the variation, a description of the same elements or components as those of the first embodiment described above may be omitted.

Figure 3A:
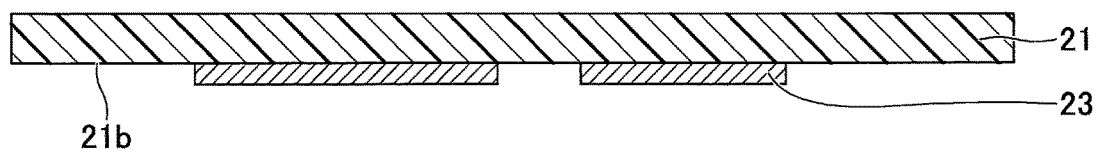
FIGS. 3A through 3C are diagrams illustrating a process of manufacturing a wiring substrate according to a variation of the first embodiment.
Figure 3B:
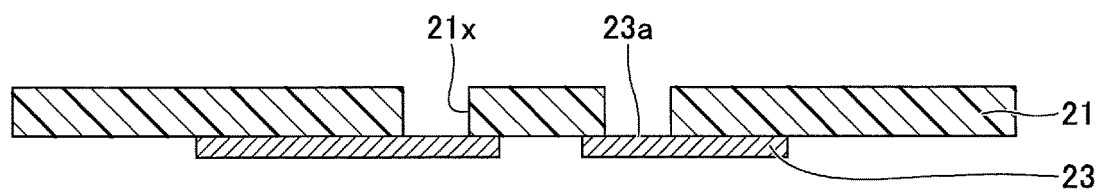
Figure 3C:
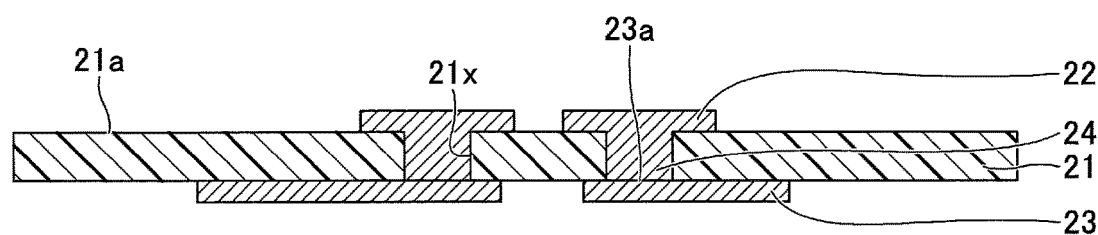

FIGS. 3A through 3C are diagrams illustrating a process of manufacturing a wiring substrate according to the variation. The processes depicted in FIGS. 3A through 3C may be executed instead of the processes depicted in FIGS. 2E and 2F of the first embodiment.

First, in the process depicted in FIG. 3A, the insulating layer 21 is prepared, and the wiring layer 23 is formed on the lower surface 21b of the insulating layer 21. The wiring layer 23 may be formed by, for example, a semi-additive process. The material and the thickness of the wiring layer 23 are as described above.

Next, in the process depicted in FIG. 3B, the through holes 21x piercing through the insulating layer 21 are formed by, for example, laser processing. An upper surface 23a of the wiring layer 23 is exposed in the through holes 21x. When the insulating layer 21 is formed of a photosensitive resin, the through holes 21x may be formed by exposure to light and development. The shape of the through holes 21x may be controlled as described above.

Next, in the process depicted in FIG. 3C, the through vias 24 are formed in the through holes 21x, and the wiring layer 22 is formed on the upper surface 21a of the insulating layer 21. The through vias 24 and the wiring layer 22 may be formed by, for example, a semi-additive process.

Specifically, a seed layer is formed of copper or the like to continuously cover the upper surface 21a of the insulating layer 21, the inner wall surfaces of the through holes 21x, and the upper surface 23a of the wiring layer 23 exposed in the through holes 21x. Next, a resist layer having openings that expose the through holes 21x and regions where the wiring layer 22 is to be formed is formed, and copper or the like is deposited in the through holes 21x and the openings to form an electroplating layer by electroplating, using the seed layer as a power feed layer. After removal of the resist layer, the seed layer not covered with the electroplating layer is removed by etching. As a result, the through vias 24 and the wiring layer 22 are formed. According to this method, the through vias 24 and the wiring layer 22 are formed of the same material as a one-piece structure.

Alternatively, the wiring layer 22 may be formed first, and the through vias 24 and the wiring layer 23 may be thereafter formed in the same manner as described above. In this case, the through vias 24 and the wiring layer 23 are formed of the same material as a one-piece structure.

After the process depicted in FIG. 3C, the process of FIG. 2G and the subsequent processes of the first embodiment are executed to complete the wiring substrate 1 as depicted in FIGS. 1A and 1B.

Thus, the through vias 24 may be formed by filling in conductive paste or formed by, for example, plating.

[b] Second Embodiment

According to a second embodiment, the shape of conductive paste that connects protruding electrodes and through vias is different from that of the first embodiment. In the description of the second embodiment, a description of the same elements or components as those of the first embodiment described above may be omitted.

Figure 4A:
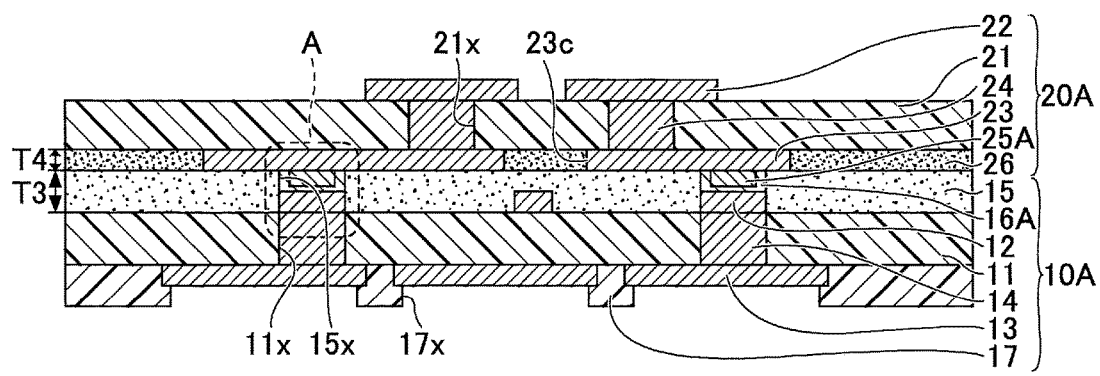
FIGS. 4A and 4B are cross-sectional views of a wiring substrate according to a second embodiment.
Figure 4B:
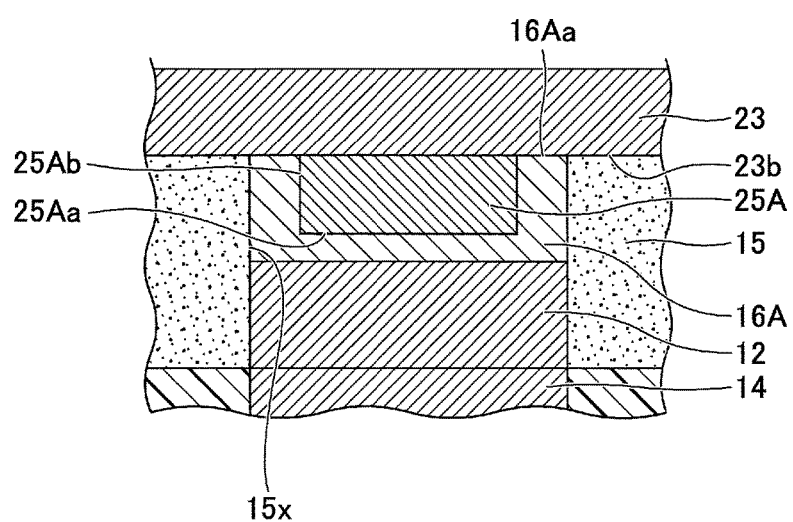

FIG. 4A is a cross-sectional view of the entirety of a wiring substrate according to the second embodiment. FIG. 4B is an enlarged view of part A of FIG. 4A.

Referring to FIGS. 4A and 4B, a wiring substrate 1A according to the second embodiment is different from the wiring substrate 1 (FIGS. 1A and 1B) of the first embodiment in that the first substrate 10 and the second substrate 20 are replaced with a first substrate 10A and a second substrate 20A, respectively.

Metal pillars 25A of the second substrate 20A and the wiring layer 12 (pads) of the first substrate 10A have, for example, a planar shape of a circle, and the metal pillars 25A are smaller in diameter than the wiring layer 12 (pads). The diameter of the metal pillars 25A may be, for example, approximately 30 μm. The diameter of the wiring layer 12 (pads) may be, for example, approximately 60 μm.

The planar shape of conductive paste 16A of the first substrate 10A is, for example, a circle that is equal or nearly equal in diameter to the wiring layer 12 (pads). The metal pillars 25A have their respective ends buried in the conductive paste 16A. For example, the metal pillars 25A are buried in the conductive paste 16A, so that the conductive paste 16A covers the entirety of a lower end face 25Aa and the entirety of a side surface 25Ab of each of the metal pillars 25. An upper end face 16Aa of the conductive paste 16A contacts the lower surface 23b of the wiring layer 23 around each of the metal pillars 25A.

A thickness T3 of the first adhesive layer 15 may be, for example, approximately 30 μm. A thickness T4 of the second adhesive layer 26 is substantially equal to the thickness of the wiring layer 23, and may be, for example, approximately 15 μm. That is, the lower surface 23b of the wiring layer 23 is exposed in the second adhesive layer 26, and is covered with the first adhesive layer 15.

Figure 5:
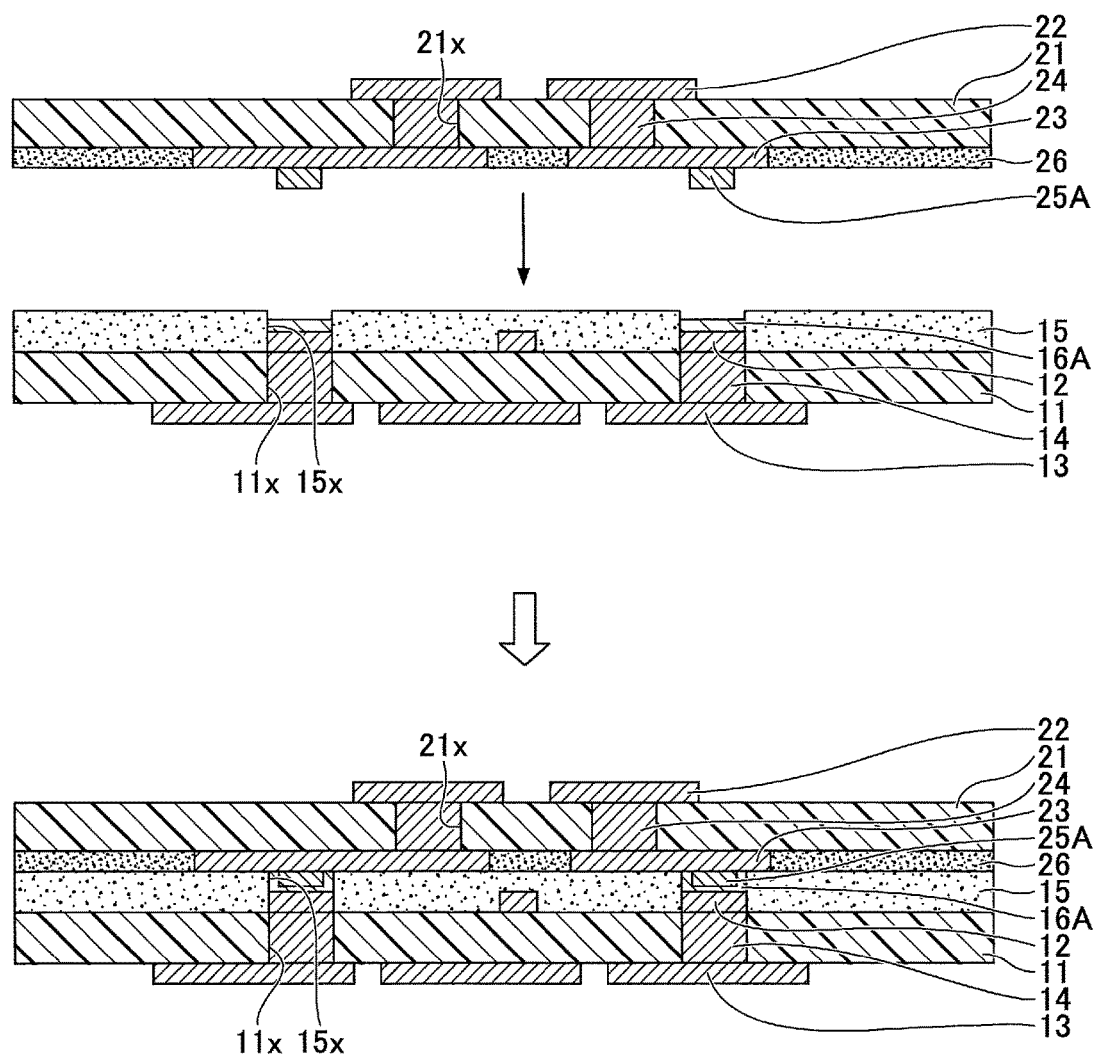
FIG. 5 is a diagram illustrating a process of manufacturing a wiring substrate according to the second embodiment.

To form the wiring substrate 1A, first, the processes depicted in FIGS. 2A through 2C of the first embodiment are executed. Thereafter, in the process depicted in FIG. 2D of the first embodiment, the individual openings 15x are partly filled with the conductive paste 16A so that the upper end face 16Aa of the conductive paste 16A is exposed, being depressed relative to the upper surface 15a of the first adhesive layer 15. Then, the processes depicted in FIGS. 2E through 2H are executed, and thereafter, as illustrated in FIG. 5, the structure obtained in the process of FIG. 2H is stacked on the structure obtained in the process of FIG. 2D. In the process depicted in FIG. 2H, however, the thickness of the second adhesive layer 26 and the thickness of the wiring layer 23 are substantially equalized. Thereafter, the conductive paste 16A, the first adhesive layer 15, and the second adhesive layer 26 are heated to a predetermined temperature to be cured while pressing the structure obtained in the process of FIG. 2H against the structure obtained in the process of FIG. 2D.

As a result, the first adhesive layer 15 and the second adhesive layer 26 are bonded together, so that the structure obtained in the process of FIG. 2H is fixed onto the structure obtained in the process of FIG. 2D. Furthermore, the conductive paste 16A is formed to cover the entirety of the lower end face 25Aa and the entirety of the side surface 25Ab of each metal pillar 25A, and the metal pillars 25A and the conductive paste 16A are joined together, so that the metal pillars 25A are electrically connected to the wiring layer 12 (pads) via the conductive paste 16A.

Thereafter, the same process as depicted in FIG. 2J is executed to complete the wiring substrate 1A (FIGS. 4A and 4B).

Thus, the conductive paste 16A may be formed to cover the entirety of the lower end face 25Aa and the entirety of the side surface 25Ab of each metal pillar 25A. This increases the contact area of the metal pillars 25A and the conductive paste 16A, so that it is possible to improve the connection reliability of the metal pillars 25A and the conductive paste 16A.

Example Application

An example application is directed to a semiconductor device where a semiconductor chip is mounted on a wiring substrate according to the first embodiment. In the description of the example application, a description of the same elements or components as those of the above-described embodiments may be omitted.

Figure 6:
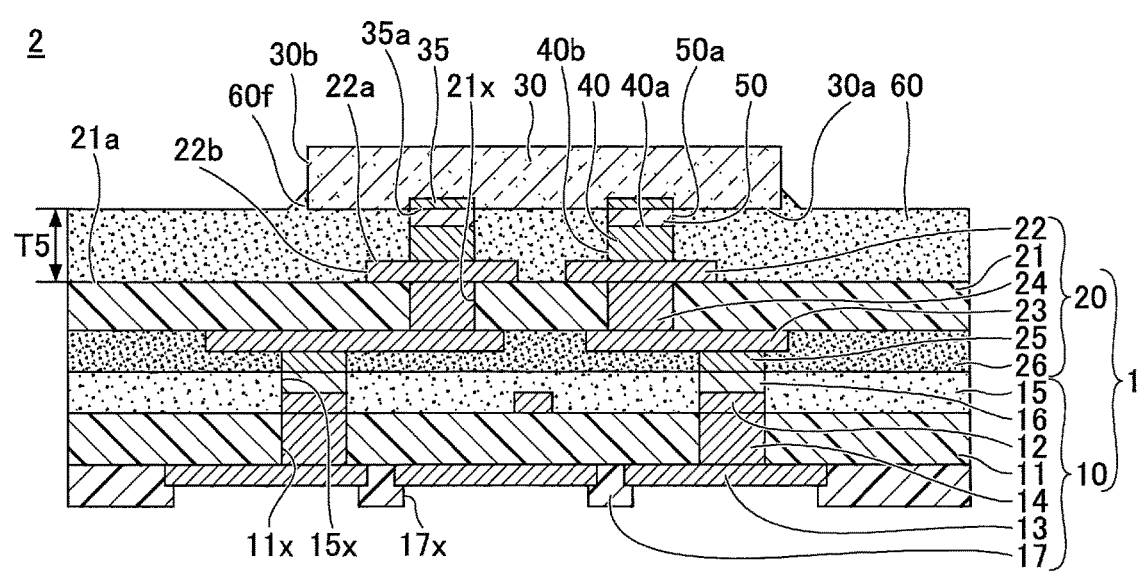
FIG. 6 is a cross-sectional view of a semiconductor device according to an example application.

FIG. 6 is a cross-sectional view of a semiconductor device according to the example application. Referring to FIG. 6, a semiconductor device 2 according to the example application includes the wiring substrate 1, a semiconductor chip 30, metal pillars 40, electrically conductive paste ("conductive paste") 50, and an adhesive layer 60.

The semiconductor chip 30 is mounted on the wiring substrate 1 by flip chip bonding. Specifically, the semiconductor chip 30 includes a circuit-formation surface 30a on which a circuit is formed, and electrode pads 35 are provided in the circuit-formation surface 30a. The semiconductor chip 30 is flip-chip bonded to the wiring substrate 1 with the circuit-formation surface 30a facing toward the wiring layer 22. The metal pillars 40, which are protruding electrodes, are formed on an upper surface 22a of the wiring layer 22. The conductive paste 50 is famed on upper end faces 40a of the metal pillars 40. The electrode pads 35 of the semiconductor chip 30 are electrically connected to the wiring layer 22 via the metal pillars 40 and the conductive paste 50. Lower surfaces 35a of the electrode pads 35 may be flush with the circuit-formation surface 30a of the semiconductor chip 30 or may be protruding or depressed relative to the circuit-formation surface 30a of the semiconductor chip 30.

The planar shape of the metal pillars 40 may be, for example, a circle having a diameter of approximately 30 μm. The planar shape of the conductive paste 50 may be, for example, a circle. In this case, the diameter of the conductive paste 50 may be equal to or nearly equal to the diameter of the metal pillars 40. The diameter of the conductive paste 50, however, may also be smaller or greater than the diameter of the metal pillars 40 when it is possible to ensure the connection reliability of the conductive paste 50 and the metal pillars 40. When the conductive paste 50 is greater in diameter than the metal pillars 40, the diameter of the conductive paste 50 may be, for example, approximately 60 μm.

Suitable materials for the metal pillars 40 include, for example, copper (Cu). The height of the metal pillars 40 may be, for example, approximately 5 μm to approximately 45 μm. As the conductive paste 50, for example, copper paste may be used. Other kinds of conductive paste than copper paste, such as silver paste and gold paste, may also be used as the conductive paste 50. The thickness of the conductive paste 50 may be, for example, approximately 5 μm to approximately 45 μm.

The adhesive layer 60 is provided over the entirety of the upper surface 21a of the insulating layer 21 to cover the upper surface 22a and a side surface 22b of the wiring layer 22, side surfaces 40b of the metal pillars 40, and a side surface 50a of the conductive paste 50. Furthermore, the adhesive layer 60 fills in where the upper surface 21a of the insulating layer 21 faces the circuit-formation surface 30a of the semiconductor chip 30, to bond the wiring substrate 1 and the semiconductor chip 30 together. Moreover, the adhesive layer 60 extends onto a side surface 30b of the semiconductor chip 30 to form a fillet 60f. The fillet 60f may be formed to, for example, surround and cover a lower portion of the side surface 30b of the semiconductor chip 30. Alternatively, the fillet 60f may be formed to surround and cover the entirety of the side surface 30b of the semiconductor chip 30. A thickness T5 of the adhesive layer 60 except for the fillet 60f may be, for example, approximately 12 μm to approximately 80 μm.

That is, the thickness T5 is the interval (distance) between the upper surface 21a of the insulating layer 21 and the circuit-formation surface 30a of the semiconductor chip 30. Compared with conventional semiconductor devices where a solder resist layer and an underfill resin are provided between the upper surface of the insulating layer of a wiring substrate and a semiconductor chip, the thickness T5 can be reduced by approximately 30 μm.

Suitable materials for the adhesive layer 60 include, for example, a photosensitive (thermosetting) insulating resin containing an epoxy resin and a polyimide resin, a non-photosensitive (thermosetting) insulating resin containing an epoxy resin and a polyimide resin, and other photosensitive or non-photosensitive (thermosetting) insulating resins. The material of the adhesive layer 60 may be suitably selected in view of, for example, adhesion to and a difference in the coefficient of thermal expansion from the insulating layer 21.

Figure 7A:
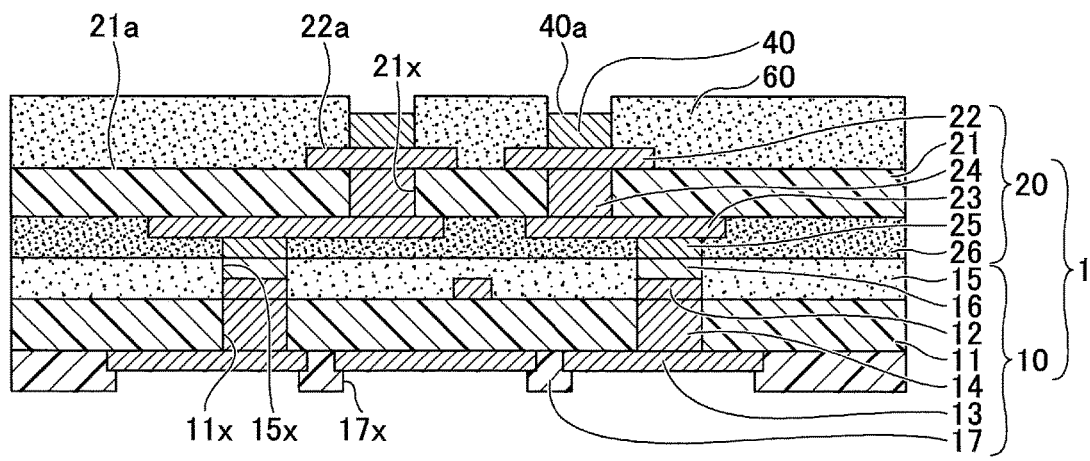
FIGS. 7A and 7B are diagrams illustrating a process of manufacturing a semiconductor device according to the example application.
Figure 7B:
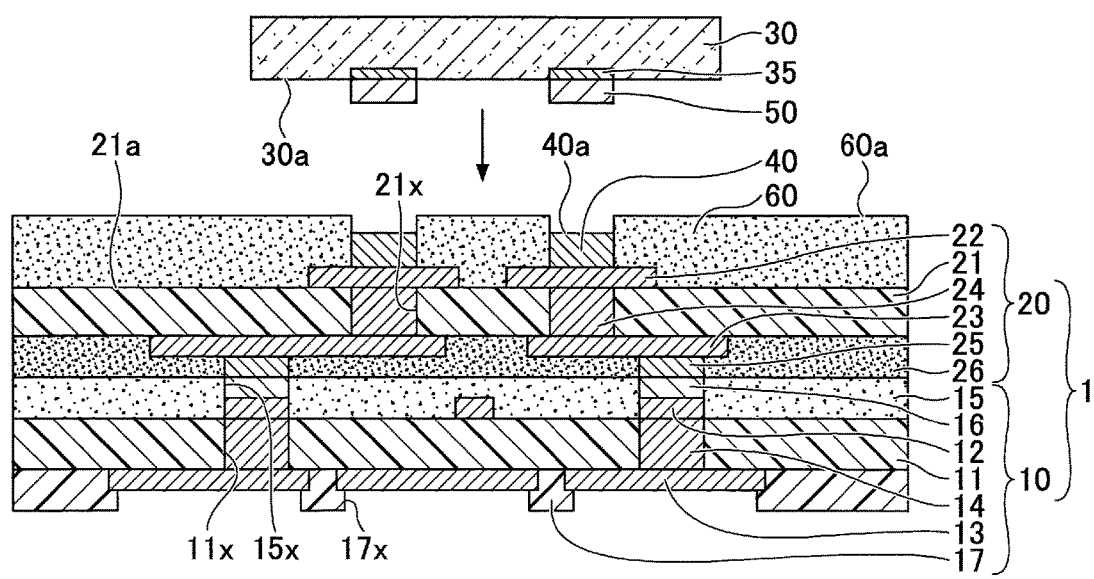

FIGS. 7A and 7B are diagrams illustrating a process of manufacturing a semiconductor device according to the example application. A specific method of manufacturing the semiconductor device 2 is described below. To form the semiconductor device 2, first, in the process depicted in FIG. 7A, the metal pillars 40 are formed on the upper surface 22a of the wiring layer 22. The metal pillars 40 may be formed by, for example, a semi-additive process. The material and the height of the metal pillars 40 are as described above. Then, the same as in the processes depicted in FIGS. 2C and 2D, the adhesive layer 60 is formed over the entirety of the upper surface 21a of the insulating layer 21 of the wiring substrate 1 to cover the wiring layer 22 while exposing the upper end faces 40a of the metal pillars 40. The material and the thickness of the adhesive layer 60 are as described above.

Next, in the process depicted in FIG. 7B, the semiconductor chip 30 having the electrode pads 35 provided in the circuit-formation surface 30a is prepared, and the conductive paste 50 is formed (printed) on the electrode pads 35, using, for example, a dispenser. The material and the thickness of the conductive paste 50 are as described above. Then, the semiconductor chip 30 is placed on the adhesive layer 60 so that the conductive paste 50 contacts the upper end faces 40a of the metal pillars 40 exposed in the adhesive layer 60 and the circuit-formation surface 30a of the semiconductor chip 30 contacts an upper surface 60a of the adhesive layer 60. Thereafter, the conductive paste 50 and the adhesive layer 60 are heated to a predetermined temperature to be cured while pressing the semiconductor chip 30 against the adhesive layer 60.

As a result, the adhesive layer 60 fills in a gap across which the upper surface 21a of the insulating layer 21 faces the circuit-formation surface 30a of the semiconductor chip 30, to bond the wiring substrate 1 and the semiconductor chip 30 together. Furthermore, the adhesive layer 60 extends onto the side surface 30b of the semiconductor chip 30 to form the fillet 60f. The electrode pads 35 of the semiconductor chip 30 are electrically connected to the metal pillars 40 via the conductive paste 50. The fillet 60f, which may be formed to, for example, surround and cover a lower portion of the side surface 30b of the semiconductor chip 30, may alternatively be formed to surround and cover the entirety of the side surface 30b of the semiconductor chip 30.

Thus, the semiconductor device 2, in which the semiconductor chip 30 is mounted on the wiring substrate 1 according to the first embodiment, can be achieved. According to the semiconductor device 2, the adhesive layer 60 provided over the entirety of the upper surface 21a of the insulating layer 21 covers the wiring layer 22 and the conductive paste 50, and fills in where the upper surface 21a of the insulating layer 21 faces the circuit-formation surface 30a of the semiconductor chip 30, to bond the wiring substrate 1 and the semiconductor chip 30 together. That is, unlike conventional semiconductor devices, a solder resist layer and an underfill resin are not provided between the upper surface 21a of the insulating layer 21 of the wiring substrate 1 and the semiconductor chip 30. Accordingly, it is possible to reduce the thickness of the whole semiconductor device 2.

Furthermore, the adhesive layer 60 extends onto at least part of the side surface 30b of the semiconductor chip 30 to form the fillet 60f. Therefore, it is possible to increase, for example, the moisture resistance of the semiconductor chip 30.

It is also possible, however, to mount a semiconductor chip on the wiring substrate 1 the same as in the conventional manner. That is, using part of the wiring layer 22 as pads, the pads of the wiring layer 22 and the electrode pads 35 of the semiconductor chip 30 are electrically connected via, for example, solder. Thereafter, an underfill resin may fill in where the upper surface 21*a* of the insulating layer 21 of the wiring substrate 1 faces the circuit-formation surface 30*a* of the semiconductor chip 30.

All examples and conditional language provided herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

Various aspects of the subject-matter described herein may be set out non-exhaustively in the following numbered clause:

1. A method of manufacturing a wiring substrate, including:
    manufacturing a first substrate, including
    forming a first adhesive layer on a surface of a first insulating layer;
    providing an opening piercing through the first adhesive layer; and
    providing a conductive paste in the opening;
    manufacturing a second substrate, including
    forming a protruding electrode on a surface of a second insulating layer; and
    forming a second adhesive layer on the surface of the second insulating layer without covering an end of the protruding electrode; and
    stacking the second substrate on the first substrate with the second adhesive layer facing the first adhesive layer, including
    electrically connecting the protruding electrode and the conductive paste; and
    bonding the first adhesive layer and the second adhesive layer.

What is claimed is:

1. A wiring substrate comprising:
    a first substrate including
        a first adhesive layer of a thermosetting material on a surface of a first insulating layer;
        a first wiring layer on the surface of the first insulating layer, the first wiring layer being exposed in an opening in the first adhesive layer; and
        a thermosetting conductive paste directly connected to the first wiring layer in the opening; and
    a second substrate stacked on the first substrate, and including
        a second wiring layer on a surface of a second insulating layer facing toward the first substrate;
        a second adhesive layer of a thermosetting material on the surface of the second insulating layer, the second adhesive layer covering a side surface of the second wiring layer and exposing a surface of the second wiring layer facing the first substrate, the second adhesive layer being bonded to the first adhesive layer; and
        a protruding electrode on the surface of the second wiring layer, the protruding electrode having an end uncovered by the second adhesive layer, the end being buried in the conductive paste, the protruding electrode being electrically connected to the conductive paste,
    wherein the surface of the second wiring layer is in direct contact with the first adhesive layer, and
    the conductive paste extends from an end face of the protruding electrode onto a side surface of the protruding electrode to cover an entirety of the side surface of the protruding electrode and contact the surface of the second wiring layer.

2. The wiring substrate as claimed in claim 1, wherein the conductive paste includes a resin and a metal powder dispersed in the resin.

3. The wiring substrate as claimed in claim 1, wherein a thickness of the second adhesive layer is substantially equal to a thickness of the second wiring layer.

4. A wiring substrate comprising:
    a first insulating layer;
    a first adhesive layer of a thermosetting material on the first insulating layer;
    a second adhesive layer of a thermosetting material on the first adhesive layer;
    a second insulating layer on the second adhesive layer;
    a first wiring layer on the first insulating layer in the first adhesive layer;
    a second wiring layer on the second insulating layer in the second adhesive layer;
    a protruding electrode on a surface of the second wiring layer that is in direct contact with the first adhesive layer, the protruding electrode protruding in a direction away from the second insulating layer to have an end uncovered by the second adhesive layer; and
    a thermosetting conductive paste between the first wiring layer and the second wiring layer to electrically connect the first wiring layer and the second wiring layer.

5. The wiring substrate as claimed in claim 4, wherein the conductive paste includes a resin and a metal powder dispersed in the resin.

6. The wiring substrate as claimed in claim 4, wherein a thickness of the second adhesive layer is substantially equal to a thickness of the second wiring layer.

* * * * *